(12) United States Patent
Martelloni et al.

(10) Patent No.: US 7,504,695 B2
(45) Date of Patent: Mar. 17, 2009

(54) SRAM MEMORY CELL AND METHOD FOR COMPENSATING A LEAKAGE CURRENT FLOWING INTO THE SRAM MEMORY CELL

(75) Inventors: Yannick Martelloni, Poing (DE); Thomas Nirschl, München (DE); Bernhard Wicht, München (DE)

(73) Assignee: Infineon Technologies AG, Munich (DE)

( * ) Notice: Subject to any disclaimer, the term of this patent is extended or adjusted under 35 U.S.C. 154(b) by 293 days.

(21) Appl. No.: 11/137,294

(22) Filed: May 25, 2005

(65) Prior Publication Data
US 2005/0281109 A1 Dec. 22, 2005

Related U.S. Application Data

(63) Continuation of application No. PCT/DE03/03551, filed on Oct. 24, 2003.

(30) Foreign Application Priority Data
Nov. 26, 2002 (DE) .................. 102 55 102

(51) Int. Cl.
*H01L 27/088* (2006.01)
(52) U.S. Cl. .............................. 257/368; 257/E27.098
(58) Field of Classification Search ................. 257/213, 257/288, 368, 379, 380, 38, E27.081, E27.098; 365/129, 154, 156
See application file for complete search history.

(56) References Cited

U.S. PATENT DOCUMENTS

| 6,181,608 B1 | 1/2001 | Keshavarzi et al. | |
| 6,262,911 B1 * | 7/2001 | Braceras et al. | 365/154 |

FOREIGN PATENT DOCUMENTS

| DE | 41 35 686 A1 | 12/1992 |
| GB | 2 256 297 A | 12/1992 |
| JP | 04188496 | 7/1992 |
| JP | 11260063 | 9/1999 |

OTHER PUBLICATIONS

Sasaki et al., "A 16-Mb CMOS SRAM with a 2.3-μm2 Single Bit-Line Memory Cell," IEEE Journal of Solid-State Circuits, IEEE, Nov. 1993, vol. 28, Issue 11, pp. 1125-1130.*
PCT International Search Report dated Apr. 23, 2004.
PCT Preliminary Examination Report dated Oct. 13, 2004.
K. Agawa, H. Hara, T. Takayanagi and T. Kuroda, "A Bit-Line Leakage Compensation Scheme for Low-Voltage SRAM's", 2000 Symposium on VLSI Circuits Digest of Technical Papers, pp. 70-71, Jun. 2000.
K. Agawa, H. Hara, T. Takayanagi and T. Kuroda, "A Bit-Line Leakage Compensation Scheme for Low-Voltage SRAMs", IEEE Journal of Solid-State Circuits, vol. 36, No. 5, pp. 726-734, May 2001.
H. Kawaguchi, Y. Itaka, and T. Sakurai, "Dynamic leakage cut-off scheme for low-voltage SRAM's", 1998 Symposium on VLSI Circuits, Digest of Technical Papers, pp. 140-141, Jun. 1998.
E. Seevinck, P. J. Van Beers and H. Ontrop, "Current-Mode Techniques For High-Speed VLSI Circuits With Application To Current Sense Amplifier For CMOS SRAM's", IEEE Journal of Solid-State Circuits, vol. 26, No. 4, pp. 525-536, Apr. 1991.

* cited by examiner

*Primary Examiner*—Evan Pert
*Assistant Examiner*—Kevin Quinto
(74) *Attorney, Agent, or Firm*—Patterson & Sheridan, L.L.P.

(57) ABSTRACT

An SRAM memory cell has at least one memory node and at least one selection transistor, which is electrically connected to the memory node, a first bit line and a first word line. Furthermore, the SRAM memory cell has means for compensating for a leakage current flowing into the SRAM memory cell. The means are designed in such a way that a current corresponding to the leakage current flows into the SRAM memory cell. In one exemplary embodiment, the means are formed as a transistor which is electrically connected to the first bit line and the second memory node, the first memory node being connected to the selection transistor.

18 Claims, 4 Drawing Sheets

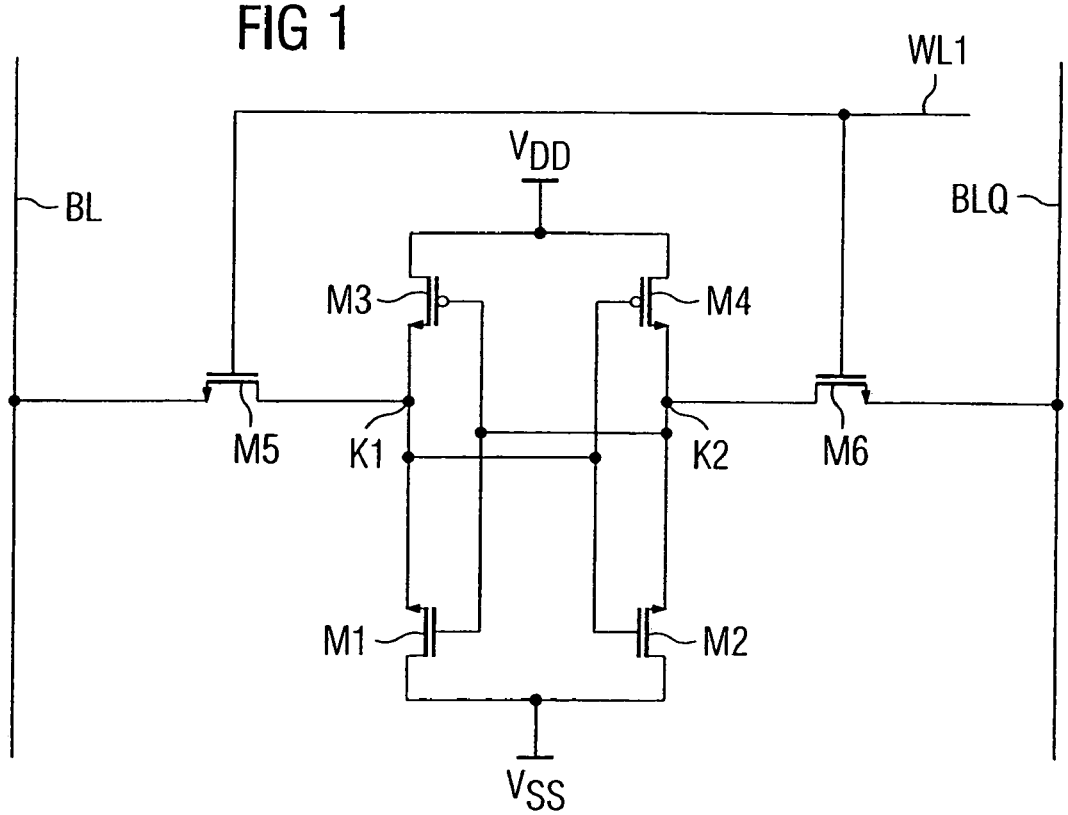
(PRIOR ART)
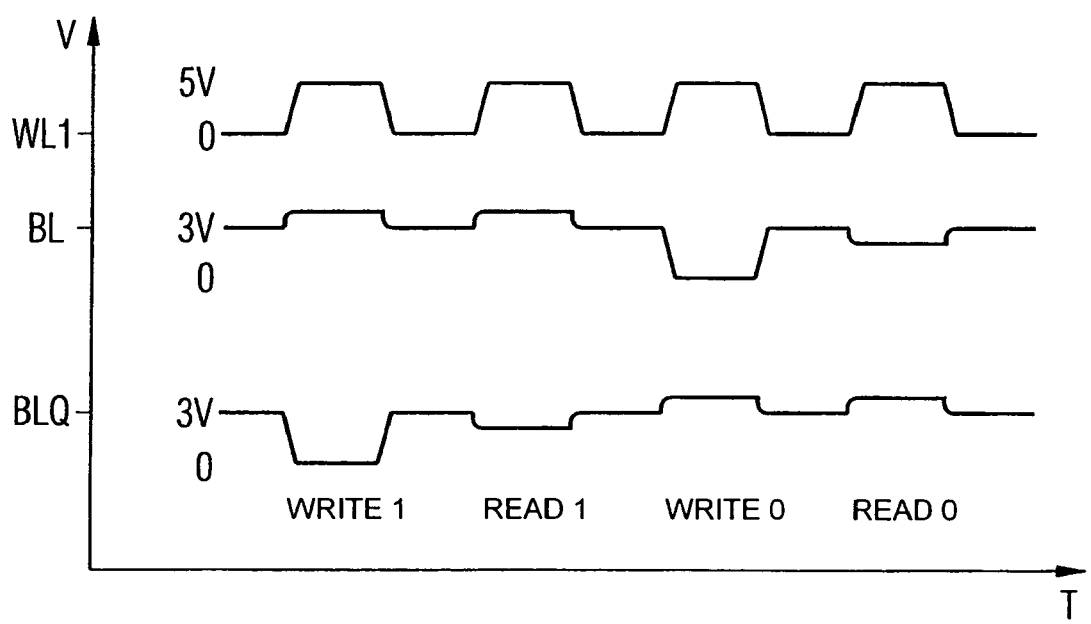

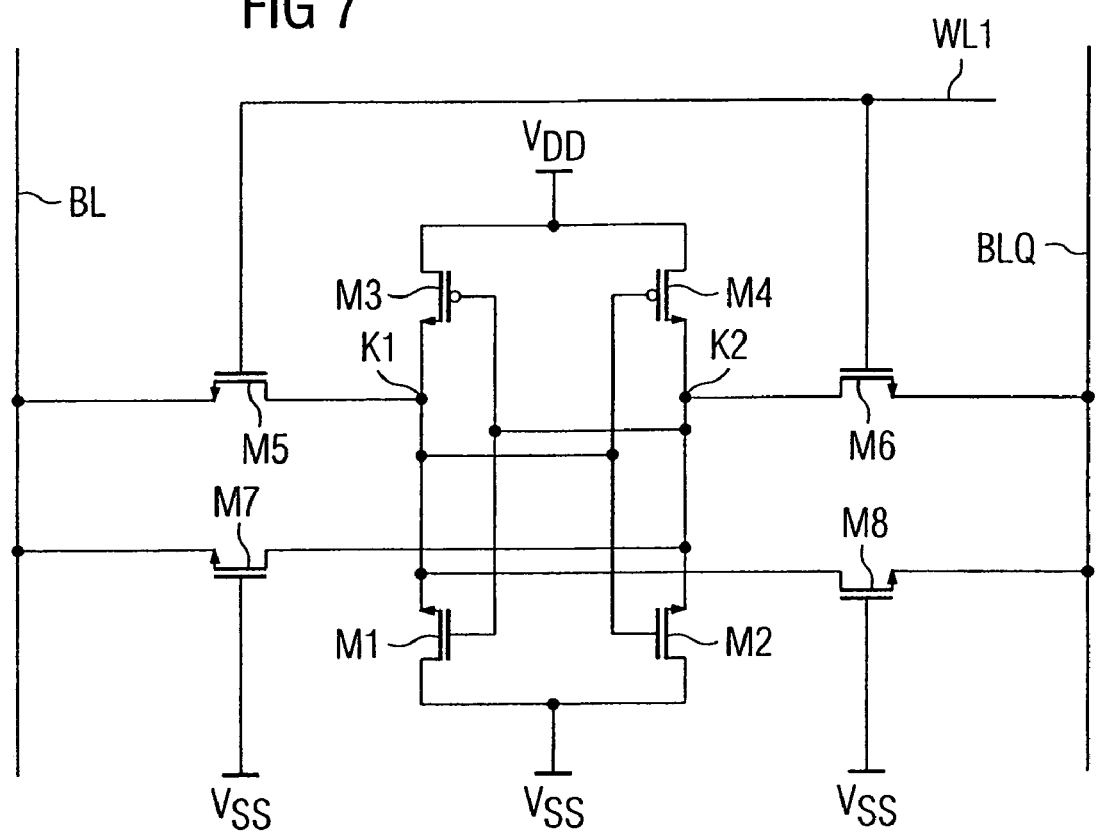

SRAM MEMORY CELL AND METHOD FOR COMPENSATING A LEAKAGE CURRENT FLOWING INTO THE SRAM MEMORY CELL

CROSS-REFERENCE TO RELATED APPLICATIONS

This application is a continuation of co-pending PCT patent application No. PCT/DE03/03551, filed 24 Oct. 2003, which claims the benefit of German patent application serial number DE 102 55 102.2, filed 26 Nov. 2002. Each of the aforementioned related patent applications is herein incorporated by reference in its entirety.

BACKGROUND OF THE INVENTION

1. Field of the Invention

The invention relates to a semiconductor memory cell, in particular a Static Random Access Memory (SRAM) memory cell, and a method for compensating for a leakage current flowing into the SRAM memory cell.

2. Description of the Related Art

Semiconductor memory cells such as static memory cells (e.g., SRAM memory cells), by way of example, are used in many instances in integrated circuits. SRAMs are fabricated as individual modules and also integrated in addition to other components on a chip. The proportion of area taken up by SRAMs in microprocessors and in other highly complex logic circuits is up to 50%. Therefore, a careful design of the SRAM and of the peripheral circuits is of great importance in many applications. An SRAM is a read-write memory with random access. The term static memory is employed since the information written in electrically can be stored without limitation as long as the supply voltage is not turned off. A known SRAM memory cell (FIG. 1) has a static latch, a static latch representing the simplest form of a bistable circuit and being constructed from two cross-coupled inverters. The first inverter has an n-channel transistor M1 and a p-channel transistor M3. The second inverter of the memory cell has an n-channel transistor M2 and a p-channel transistor M4. What is achieved by the cross-coupling of the inverters is that the output of one inverter controls the input of the other inverter. The two CMOS inverters are electrically connected to complementary bit lines BL and BLQ via two NMOS selection transistors M5 and M6. The use of complementary bit lines BL and BLQ increases the reliability and reduces the sensitivity toward fluctuations of the device characteristic parameters. The gate terminals of the selection transistors M5 and M6 are in each case electrically connected to a first word line WL1. The selection transistor M5 is connected to a first memory node K1 of the memory cell and the selection transistor M6 is connected to a second memory node K2 of the memory cell. The SRAM memory cell illustrated in FIG. 1 is referred to as a 6T memory cell. Because of the "active load elements" M3 and M4, this cell type requires only relatively short times for reading or writing data. A further embodiment (not illustrated) of an SRAM memory cell is the 4T SRAM memory cell, in which the transistors M3 and M4 are replaced by passive load elements. The proposed concept can also be used for other types of memory cells.

The method of operation of the memory cell having active load elements in accordance with FIG. 1 is explained on the basis of the voltage profiles—shown in FIG. 2—of signals that flow through the first word line WL1 and the bit line pair BL and BLQ. External signals are represented by trapezoidal shapes in FIG. 2, while the generally weaker signals of the memory cell have been depicted with more realistic rise and fall times. It is assumed, by way of example, that a first logic state "1" is defined by a high potential on the left-hand side of the memory cell in the memory node K1. It follows from this that the transistor M1 turns off in this state. A write or read operation is initiated by the transistors M5 and M6 being activated under the control of the first word line WL1. A write operation is carried out by drivers pulling the signal on the bit line BL and by pulling the signal on the bit line BLQ that is complementary thereto to logic levels "0" and "1", respectively. In order to write a first logic state "1" to the memory cell, it is necessary, according to the definition assumed above, for the complementary bit line BLQ to have a logic state "0".

Generally, it can be stated that that memory node (K1 or K2) of the memory cell which is intended to be brought to a low potential has to be brought to a voltage less than the switching threshold of the opposite inverter from outside the memory cell. The other node is intended to lie above a voltage threshold.

For the above mentioned writing in of a logic state "1", i.e. to overwrite a stored logic state "0", this means that the memory node K2 has to be brought to a potential less than the switching threshold of the opposite inverter. During the write operation, the transistors M6 and M4 form a voltage divider, which has to be dimensioned in accordance with the above specification. The resistance of the transistor M4 must be several times greater than the resistance formed by the transistor M6. Thus, during the write operation, the transistor M1 is turned off and the memory node K1 is pulled to a higher voltage potential by the transistors M5 and M3. When memory node K1 is pulled to a higher voltage potential, the transistor M2 is turned on. The first word line WL1 can then be switched off again since the desired state has been written to the cell.

In order to read out the logic state "1", first the bit lines BL and BLQ are precharged to a precharge voltage. The precharge voltage is chosen in such a way that the cell is not written to unintentionally according to mechanisms described previously. Choosing the precharge voltage in such a way that the cell is not written to unintentionally is referred to as nondestructive reading. In the event of access to the memory cell, a current flows via the transistors M5 and M3 and also M6 and M2, depending on the precharge voltage. In order that the memory state of the memory cell is not changed, however, the memory node K2 has to be brought to a potential less than the switching threshold of the opposite inverter. It follows from this that the resistance formed by the transistor M6 must be approximately three times as large as that of the transistor M2. The writing and reading of the logic state "0" to and from the memory cell are effected in a corresponding manner.

Generally, an operation of writing a logic state to the memory cell may be described as follows. The bit line pair BL and BLQ is precharged to a high potential (as an alternative, said bit lines can also be precharged to a low potential or to an arbitrary reference voltage). If the word line is selected, the selection transistors connected to the memory cell are switched on. One of the memory nodes of the memory cell has a memory state "0" and the other memory node has a memory state "1". The memory node which has the low memory state "0" pulls the bit line connected to said memory node to a low potential (logic state "0"). A sense amplifier (not illustrated) accelerates the read-out and amplifies the fall of the signal on the bit line connected to the voltage node having the memory state "0" from the state with a high potential to the state with a low potential and simultaneously holds the high potential state on the second bit line. The sense amplifier starts to operate or read out a state only when a specific voltage difference occurs between the two bit lines BL and BLQ. In addition to the voltage amplification described, the current of the memory cell can also be directly amplified.

An operation of writing a memory state to a memory cell can generally be carried out as follows. One of the bit lines is precharged to a high potential and the other bit line of the bit line pair is precharged to a low potential. If the memory cell to which a memory state is intended to be written is selected via a word line and if the memory states in the two memory nodes of the memory cell correspond to the potential states on the bit lines to which the respective memory node of the memory cell is connected, then the memory states in the two memory nodes remain unchanged. However, if the memory nodes have memory states which are different from the potentials of the bit lines to which a respective one of the memory nodes is connected, the memory states in the memory nodes are changed. That memory node which has stored a logic memory state "1" (high potential) is thereby pulled to a logic memory state "0" (low potential). In a corresponding manner, the state of the other memory node is set from a logic memory state "0" (low potential) to a logic memory state "1" (high potential).

One disadvantage in the case of semiconductor memory cells, in particular in the case of the SRAM memory cells, is the problem area that leakage currents flow into the memory cell, in particular when the memory cell of a memory cell array is connected to a plurality of memory cells in the non-selected state. One possibility for keeping the leakage current as low as possible is afforded by choosing the threshold voltage of the transistors of the memory cell to be relatively high. However, this in turn results in the disadvantage that the reading or writing of a memory state from or to the memory cell proceeds more slowly and the sequence of a memory operation is significantly impaired.

As depicted in FIG. 3, a multiplicity of memory cells $Z_0$ to $Z_n$ are usually connected to a bit line pair BL and BLQ. If the memory state of the memory cell $Z_0$ is read out, a current $i_C$ flows into the cell in the exemplary embodiment illustrated. The current on the bit line BLQ therefore decreases and has the value I-ic. At the same time, leakage currents $i_{L1}$ to $i_{LN}$ flow from the bit line BL into the corresponding cells $Z_1$ to $Z_N$ which are in each case in the non-selected state. This results in an overall leakage current $i_L$, whereby a current I-$i_L$ flows from the bit line BL into a current evaluation circuit SBS. The current difference between the two bit lines BL and BLQ is determined by means of this current evaluation circuit SBS or "sense amplifier". The current evaluation circuits SBS use the current signals I-$i_C$ and I-$i_L$ directly to determine the memory state in the memory cell to be read. Voltage sense amplifiers, by contrast, use the voltage difference between the two bit lines that is generated when reading from the selected memory cell between the two bit lines BL and BLQ. Both the current evaluation circuit SBS and a voltage sense amplifier circuit evaluate a memory state read out from a memory cell only when a certain voltage difference $\Delta V$ or a certain current difference $\Delta I$ occurs between the two bit lines. As illustrated in FIG. 4, the memory state of the memory cell $Z_0$ can be evaluated by the current evaluation circuit SBS (FIG. 3) only when a current difference greater than or equal to $\Delta I$ occurs between the bit lines BL and BLQ. If no leakage current $i_{L1}$ to $i_{LN}$ flowed into the non-selected memory cells $Z_1$ to $Z_N$ in FIG. 3, then the current on the bit line BL would have a constant value I.

As a result of the read-out of the memory cell $Z_0$, the current $i_C$ flows into the memory cell $Z_0$ and the current on the bit line BLQ falls over time in accordance with the upper illustration in FIG. 4. The current difference $\Delta I$ between the bit lines BL and BLQ that is required for read-out by the current evaluation circuit SBS (FIG. 3) is therefore reached at the instant $t_1$. However, since leakage currents in each case flow into the non-selected memory cells $Z_1$ to $Z_N$, as already mentioned, the current on the bit line BL is reduced to the constant value I-$i_L$. As a result, as illustrated in the lower current curve profile in FIG. 4, the current difference $\Delta I$ between the bit lines BL and BLQ is not reached until at a later instant $t_2$. As a result of the total leakage current $i_L$, the read-out of a memory state is significantly prolonged. The instant at which the read-out begins is delayed by $t_2-t_1$. Depending on how many memory cells are arranged between the bit lines BL and BLQ, and on the magnitude of the leakage currents that in each case flow into the non-selected memory states, in extreme cases there may even be the consequence that the overall leakage current $i_L$ is just as large as the current I which originally flows through the lines BL and BLQ. In such a state, it is no longer possible to read out a memory state of a selected memory cell since the current difference $\Delta I$ required for the read-out cannot be reached. Therefore, it is particularly important to minimize the leakage currents or avoid them in such a way that they no longer have any influence for the assessment or the writing-in of a memory state and do not delay a write/read operation.

U.S. Pat. No. 6,181,608 B1 discloses a 6T SRAM memory cell and a method for reading from this memory cell by means of which the problem area of leakage current may be prevented. For this purpose, the SRAM memory cell has selection transistors having a lower threshold voltage than the transistors of the two inverters of the SRAM memory cell. Furthermore, the integrated circuit in which the SRAM memory cells are arranged has a control circuit for controlling the voltages of the word lines. Said control circuit is connected to all the word lines of the integrated circuit. The signals on the word lines are set by said control circuit in such a way that the leakage current that flows into the non-selected memory cells is intended to be minimized. For this purpose, the gate terminals of the selection transistors of the non-selected memory cells are not connected to ground potential $V_{SS}$. Rather, the gate terminals of the selection transistors are "underdriven" by virtue of the control circuit applying a negative voltage in the range of a few to a few hundred millivolts to the word lines connected to the non-selected memory cells. A disadvantage of this circuit arrangement is that, on the one hand, a relatively costly and complex circuit structure is necessary for controlling said word lines and the signals thereof and, on the other hand, the "underdriving" of the word lines connected to the non-selected memory cells is relatively difficult and can only be carried out very inaccurately. As a result, the leakage currents that flow into the individual non-selected memory cells cannot be eliminated and significantly influence the reading from or writing to the memory cell.

Furthermore, Agawa, K. et al.: "A Bit-Line Leakage Compensation Scheme for Low-Voltage SRAMs" in Digest of Technical Papers, Symposium on VLSI Circuits, pp. 70-71, June 2000, discloses a circuit arrangement for compensation of a bit line leakage current. The leakage current flowing into the non-selected memory cells from a bit line is detected during a precharge cycle and compensated for by an additional circuit arrangement in the integrated circuit during a write/read operation. The leakage current compensation circuit is electrically connected to the two bit lines of a bit line pair and arranged between the memory cells and the current evaluation circuit connected downstream. The leakage current compensation circuit has two p-channel transistors arranged symmetrically between the bit lines of the bit line pair, a respective one of these two p-channel transistors being used to detect the leakage current on that bit line to which the respective p-channel transistor is connected. Furthermore, the leakage current compensation circuit has two other p-channel transistors that are also formed in a symmetrical arrangement between the bit lines of the bit line pair. By means of these two additional p-channel transistors, a current having the same magnitude as the detected leakage current is passed onto the respective bit line in order to compensate for the detected leakage current. This compensation by means of the two additional p-channel transistors is effected during a write/read operation of a memory cell of the memory cell array. The four p-channel transistors are controlled in such a way that the detected leakage current is stored in a capacitance of the leakage current compensation circuit and the stored leakage current flows onto the bit line by means of an activation signal for activating the second p-channel transistors. The leakage current is thus firstly converted into a voltage and stored in a capacitance of the leakage current compensation circuit. A compensation current is generated therefrom and is applied to the corresponding bit line for compensation of the leakage current. This circuit arrangement for leakage current compensation is very costly and very complex in its construction. A further disadvantage of this arrangement is the large capacitance required to store the leakage current. Furthermore, this circuit arrangement only detects the total leakage current, that is to say the sum of all those leakage currents which flow into the non-selected memory cells of the memory cell array. This compensation circuit does not make it possible to compensate for the leakage current separately in each individual memory cell into which a specific leakage current flows.

Kawaguchi, H. et al.: "Dynamic Leakage Cut-off Scheme for Low-Voltage SRAMs" in Digest of Technical Papers, Symposium on VLSI Circuits, pp. 140-141, June 1998, discloses a circuit arrangement for leakage current reduction in which the bias voltages of the n-type and p-type well regions in the substrate are changed dynamically to supply voltage potential VDD and ground potential VSS, respectively, to the selected memory cell, while the bias voltages of the well regions of the non-selected memory cells are held at the respective voltage potential (for the n-type well region approximately 2×VDD and for the p-type well region approximately −VDD). As a result, the threshold voltage of the selected memory cell becomes relatively low and the threshold voltage of the non-selected memory cells becomes relatively high. A significant disadvantage of this circuit arrangement is that the bias voltage coefficient of the substrate is significantly reduced as a result of the dynamic variation of the substrate voltage and constitutes a decisive disadvantage particularly in the case of recent technologies.

Therefore, it is an object of the invention to provide a circuit and a method by means of which the leakage current can be compensated for in a simple manner and with a low outlay and whereby the time duration for a write/read operation is only minimally prolonged.

SUMMARY OF THE INVENTION

A semiconductor memory cell according to one embodiment of the invention is designed in particular as an SRAM memory cell and is electrically connected to at least one data line. The semiconductor memory cell has at least one memory node. Furthermore, the semiconductor memory cell comprises at least one selection transistor of a first conduction type which is electrically connected to the first memory node of a first data line and a first word line. One concept of the invention is that the semiconductor memory cell comprises means for compensating for a leakage current flowing into the semiconductor memory cell. Said means for compensating for the leakage current are designed in such a way that a current corresponding to the leakage current flows into the semiconductor memory cell. As a result, it is possible to construct a semiconductor memory cell which is constructed in a simple manner and by means of which the leakage current that flows into the semiconductor memory cell, in particular in the non-selected state of the memory cell, can be compensated for rapidly and with a low outlay. Independently of the magnitude of said leakage current, a current corresponding to the leakage current is always generated and additionally flows into the semiconductor memory cell. Furthermore, through the means for compensating for the leakage current flowing into the semiconductor memory cell, the leakage current in each individual semiconductor memory cell can be compensated for separately or determined in respect of its magnitude and can be taken into account in the assessment as a variable that can be determined in a simple manner.

In one exemplary embodiment, the means for compensating for the leakage current, in particular the leakage current in the non-selected state of the semiconductor memory cell, are designed in such a way that at least one additional electrical connection is present between said means of the semiconductor memory cell and one of the data lines connected to the semiconductor memory cell. What can thereby be achieved is that a current that is identical in magnitude to the leakage current is injected independently of the memory states of the semiconductor memory cell that are stored in the respective memory nodes. This is advantageous for the compensation of a leakage current that flows into the semiconductor memory cell in the non-selected state of said semiconductor memory cell.

In another embodiment, the means for compensating for the leakage current is electrically connected to at least one of the memory nodes of the semiconductor memory cell. The means for compensating for the leakage current are connected to the first data line and to ground potential.

In yet another exemplary embodiment, the means for compensating for the leakage current flowing into the semiconductor memory cell, in particular the leakage current flowing from the first data line into the first memory node of the semiconductor memory cell, have a first transistor of a first conduction type, which is electrically connected to the first data line by its source terminal and to ground potential by its gate terminal. Said first transistor is connected to the second memory node of the semiconductor memory cell by its drain terminal and always has the closed or conducting state. Depending on the memory state in the memory nodes, these electrical connections of the first transistor of the means for compensating for the leakage current produce a current corresponding to the leakage current which can flow into the second memory node of the semiconductor memory cell in the same way as a leakage current can flow into the first memory node. An optimized configuration for eliminating the problem area of leakage current is thereby achieved in particular in the case of memory cells designed in single-ended form.

The leakage currents flowing into the non-selected memory cells of a memory cell array having a plurality of semiconductor memory cells are thereby compensated for in an efficient and effective manner. The reading or the writing of a memory state from or to a selected semiconductor memory cell of the memory cell array can be effected rapidly and reliably because a write/read operation into a selected semiconductor memory cell is no longer corrupted or delayed by the leakage currents flowing into the non-selected semiconductor memory cells. The leakage current of all the memory cells connected to the data lines is known, so that the leakage currents of the non-selected memory cells are subtracted from a reference current flowing through the data line and a known constant value is present as a result. The reading or writing of a memory state from or to a selected memory cell can therefore be effected simply and very accurately.

In a further advantageous exemplary embodiment, the semiconductor memory cell has a second selection transistor of a first conduction type, which is electrically connected to the second memory node by its drain terminal and to a second data line by its source terminal. It may be provided that the second selection transistor is electrically connected to the first word line by its gate terminal. It may also be provided that the second selection transistor is electrically connected to a second word line by its gate terminal. The first and second data lines are preferably designed as complementary bit lines, whereby the data can be transferred more reliably and at higher speed in comparison with a single data line or bit line.

In another embodiment of the invention, the means for compensating for the current flowing into the semiconductor memory cell, in particular the first leakage current flowing from the first data line into the first memory node in the non-selected state of the semiconductor memory cell and/or the second leakage current flowing from the second data line into the second memory node, are electrically connected to the first and second data lines and to the first and second memory nodes of the semiconductor memory cell. Independently of what leakage current components flow from the two data lines into the semiconductor memory cell, it is thereby possible to achieve a compensation of said leakage current components in a simple and reliable manner.

In another embodiment, the means for compensating for the leakage current flowing into the semiconductor memory cell comprise a first transistor, which is electrically connected to the second memory node by its drain terminal and, by its source terminal, to a first data line for the purpose of producing a first additional electrical connection between the second memory node of the semiconductor memory cell and the first data line. In one embodiment, the semiconductor memory cell or the means for compensating for the leakage current further comprise a second transistor of the first conduction type. The second transistor is electrically connected to the first memory node by its drain terminal, to the second data line by its source terminal, and by its gate terminal to ground potential for the purpose of producing a second additional electrical connection between the semiconductor memory cell and a data line already connected to the memory cell. As a result, the leakage currents flowing via the data lines and the selection transistors into the memory nodes connected thereto can be compensated for rapidly and very accurately since, through the first and second additional electrical connections, currents corresponding to the leakage currents flow from the respectively complementary data lines into the semiconductor memory cell. On account of this symmetrical arrangement of the means for compensating for the leakage current or the leakage current components a current of identical magnitude corresponding to the leakage current always flows into the memory cell on the data lines connected to the memory cell. In one embodiment, this is applicable to a differential embodiment of the semiconductor memory cell.

In another embodiment, the semiconductor memory cell is designed as a 6T SRAM memory cell and has a first and a second inverter, each of these two inverters comprising a transistor of a first conduction type and a transistor of a second conduction type and the two inverters being cross-coupled between the first and second memory nodes. The two transistors of the first inverter are electrically connected to the first memory node and the two transistors of the second inverter are electrically connected to the second memory node of the semiconductor memory cell. In another embodiment, the semiconductor memory cell may be a 4T SRAM memory cell.

Generally it can be stated that the memory cell concept according to embodiments of the invention is not restricted to SRAM memory cells. Embodiments of the invention may be used for all semiconductor memory cells which have only one selection transistor and two memory nodes. According to other embodiments of the invention, the memory cell concept may be applied to semiconductor memory cells having at least two selection transistors and one memory node.

In one embodiment of the invention, a method is provided for compensating for a leakage current flowing into the semiconductor memory cell, in particular a leakage current flowing into the memory cell in the non-selected state of the semiconductor memory cell. In one embodiment, a first additional electrical connection is produced between the semiconductor memory cell and a data line that is already electrically connected to the semiconductor memory cell.

In another embodiment, the first additional electrical connection is produced between the semiconductor memory cell and the data line electrically connected to the semiconductor memory cell by means of a transistor which is always operated in the closed or conducting state.

In one embodiment, a first selection transistor of the semiconductor memory cell is connected to a first data line and a first memory node of the semiconductor memory cell and the first transistor is electrically connected to the first data line and a second memory node of the semiconductor memory cell.

In one embodiment, a second additional electrical connection is formed between the semiconductor memory cell and one of the data lines electrically connected to the semiconductor memory cell, the first additional electrical connection being produced to a first data line and the second additional electrical connection being produced to a second data line.

In other embodiments, it may be provided that the second additional electrical connection is produced between the semiconductor memory cell and the second data line connected to the semiconductor memory cell by means of a second transistor which is always operated in the closed state.

In one embodiment, a second selection transistor of the semiconductor memory cell is electrically connected to the second data line and a second memory node of the semiconductor memory cell and the second transistor is electrically connected to the second data line and a first memory node of the semiconductor memory cell.

In other embodiments, leakage currents flowing from the first and/or second data line into the first and/or second memory node, respectively, are compensated for by virtue of the fact that a current respectively corresponding to the leakage currents flows from the second and/or first data line, respectively, into the first and/or second memory node, respectively, via the second and/or first additional electrical connection, respectively.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a 6T SRAM memory cell known from the prior art;

FIG. 2 shows a signal profile on a word line and two complementary bit lines of a known memory cell in accordance with FIG. 1 during operations of writing/reading logic states to/from the SRAM memory cell;

FIG. 7 shows a third exemplary embodiment of a semiconductor memory cell according to one embodiment of the invention.

In all the figures, identical or functionally identical elements are provided with the same reference symbols.

DETAILED DESCRIPTION OF THE PREFERRED EMBODIMENT

Figure 3:
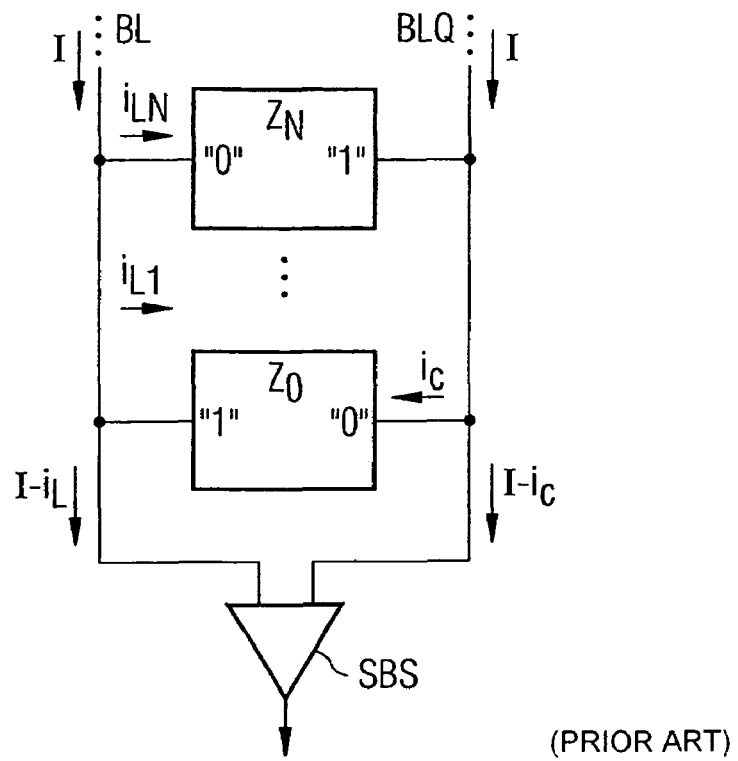
FIG. 3 shows an arrangement of a plurality of memory cells in a memory cell array known from the prior art.
Figure 4:
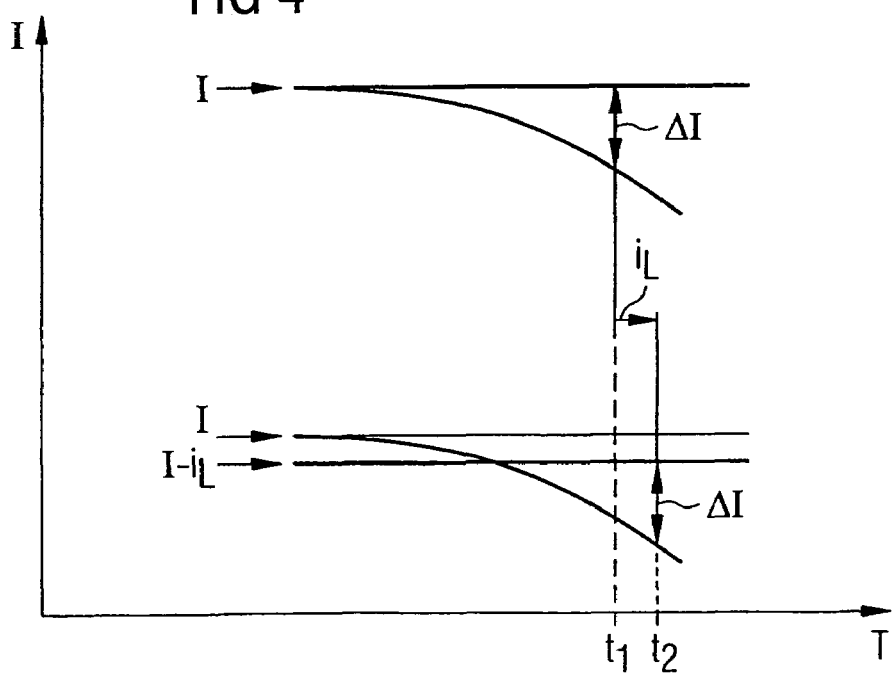
FIG. 4 shows an illustration of a temporal delay in the read-out of a memory state from a memory cell with the occurrence of leakage currents.

In a first exemplary embodiment, the semiconductor memory cell (FIG. 5) is embodied as an SRAM memory cell that has two cross-coupled inverters connected to supply voltage potential VDD and ground potential $V_{SS}$. The first inverter has an n-channel transistor M1 and a p-channel transistor M3. The second inverter comprises an n-channel transistor M2 and a p-channel transistor M4. Arranged between the two transistors M1 and M3 is a first memory node K1 and arranged between the transistors M2 and M4 is a second memory node K2 of the SRAM memory cell. A selection transistor M5 is connected to the first memory node K1 by its drain terminal, to a first bit line BL by its source terminal and to a first word line WL1 by its gate terminal. Furthermore, the SRAM memory cell has an n-channel transistor M7, which is electrically connected to the second memory node K2 and the source terminal of the transistor M3 by its drain terminal, to the first bit line BL by its source terminal and to ground potential $V_{SS}$ by its gate terminal. By means of said transistor M7, which is always in the closed state, a first additional electrical connection is produced between the first bit line BL and the second memory node K2 of the SRAM memory cell. In the non-selected state of the memory cell illustrated in FIG. 5 (word line WL1 at low potential), the selection transistor M5 turns off. A known reference current $I_{REF}$ is applied to the bit line BL. Depending on what memory states are stored in the memory nodes K1 and K2, a larger or smaller leakage current flows into the semiconductor memory cell.

By way of example, suppose that a logic state "0" is stored in the memory node K1 and a logic state "1" is stored in the memory node K2. A large leakage current therefore flows away from the bit line BL via the selection transistor M5 into the memory node K1 (large in comparison with the leakage current that would flow into the memory node in the case of a logic state "1" stored in the memory node K1) and via the transistor M1.

If a logic state "0" were stored in the memory node K2, then a leakage current would flow away from the bit line BL via the conducting transistor M7 into the memory node K2 and via the closed transistor M2. Independently of what logic state are stored in the memory nodes K1 and K2, a current corresponding to the leakage current thus flows into each non-selected memory cell connected to the bit line BL. Since the number of said non-selected memory cells is known, the associated leakage current that flows into each of said cells is also known. This known total leakage current can be treated as a constant variable that is subtracted from the reference current $I_{REF}$ for the assessment of a memory state of a selected memory cell connected to this bit line BL. Through the transistors M5 and in particular M7, therefore, a current corresponding to the leakage current is always generated independently of the memory states in the memory nodes K1 and K2 and, in the non-selected state of the memory cell, flows into the latter and thus as it were compensates for the leakage current by virtue of the fact that it is generated in each cell and can thus be treated as a known variable in the further assessment. Therefore, in this exemplary embodiment, compensation is understood as the flowing of a current identical in magnitude to the leakage current into the memory cell via the transistors M5 and M7.

Figure 5:
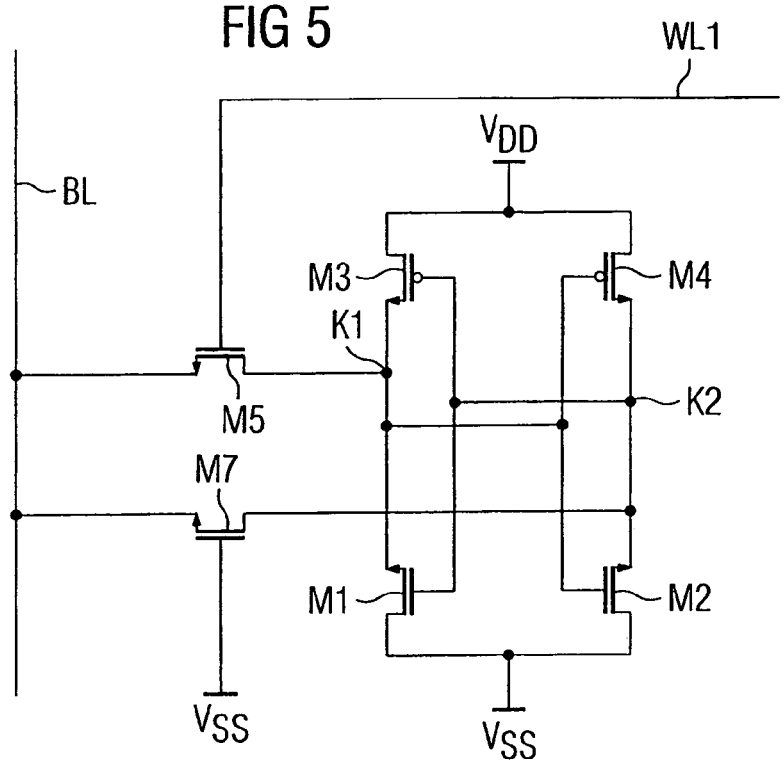
FIG. 5 shows a first exemplary embodiment of a semiconductor memory cell according to one embodiment of the invention.

The exemplary embodiment of the SRAM memory cell as illustrated in FIG. 5 can be used for single-ended write and read operations. If, in a memory cell array having at least two SRAM memory cells designed in accordance with FIG. 5, one of these two SRAM memory cells is selected for a write/read operation, its memory state can be read out via the first bit line BL or a memory state can be written in.

Figure 6:
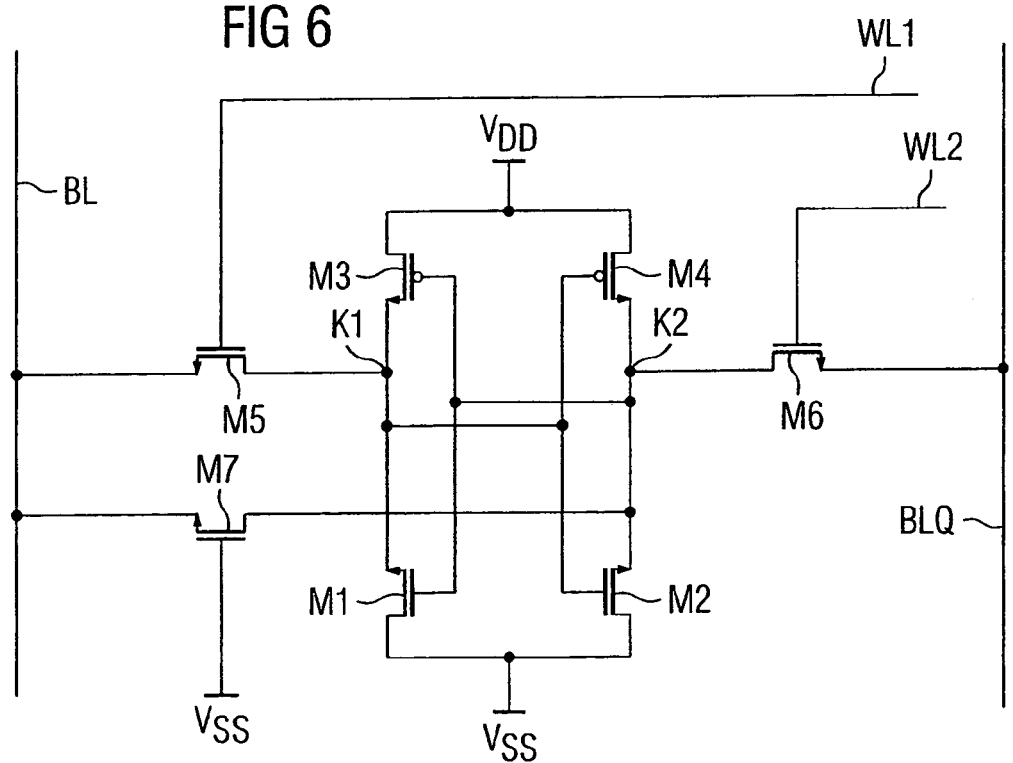
FIG. 6 shows a second exemplary embodiment of a semiconductor memory cell according to one embodiment of the invention.

In a second exemplary embodiment, depicted in FIG. 6, the SRAM memory cell is constructed in accordance with the SRAM memory cell in FIG. 5 and additionally has a second selection transistor M6, which is electrically connected to the second memory node K2 by its drain terminal, to a second bit line BLQ, which is complementary to the first bit line BL, by its source terminal, and to a second word line WL2 by its gate terminal. This exemplary embodiment of the SRAM memory cell has a 6T SRAM memory cell as a core cell. This exemplary embodiment of the SRAM memory cell may be used for single-ended read operations and for differential write operations. For read operations, only the first word line WL1 is put at high potential; for write operations, both word line WL1 and WL2 are put at high potential.

In a third exemplary embodiment of a semiconductor memory cell as depicted in FIG. 7, an n-channel transistor M8 is arranged in addition to the SRAM memory cell illustrated in FIG. 2. Transistor M8 is electrically connected to the first memory node K1 by its drain terminal, to the second bit line BLQ by its source terminal, and to ground potential $V_{SS}$ by its gate terminal. As a result, a second additional electrical connection is formed between the semiconductor memory cell and a data line or bit line BLQ connected to the semiconductor memory cell. The bit line BL is electrically connected both to the first and to the second memory node via the transistors M5 and M7, and the bit line BLQ is likewise connected to the two memory nodes K1 and K2 via the transistors M6 and M8. Furthermore, in this exemplary embodiment the second selection transistor M6 is not electrically connected to a second word line WL2 but rather to the first word line WL1, to which the first selection transistor M5 is also connected.

If this SRAM memory cell illustrated in FIG. 7 is in the non-selected state and if a logic state "0" is stored in the memory node K1, by way of example, a comparatively large first leakage current flows away from the first bit line BL via the first selection transistor M5 into the first memory node K1 and via the closed transistor M1 to ground. At the same time, the transistor M8 connected to the transistor M1 and the bit line BLQ is pulled to the potential of the node to which the transistor M1 and M8 are connected, said potential being changed as a result of the leakage current. A current corresponding to the leakage current flowing into the node K1 is thereby generated and flows away from the bit line BLQ via the transistor M8 and the transistor M1 to ground. Therefore, a substantially identical current flows into the semiconductor memory cell from the two bit lines BL and BLQ. A smaller leakage current flows from the bit line BLQ into the memory node K2, in which the logic state "1" is stored, said leakage current being negligible in comparison with the leakage current which into the memory node K1, in which the logic state "0" is stored. The sequence proceeds in an analogous manner if a logic state "0" was stored in the memory node K2. When reading a memory state from a selected memory cell connected to the bit lines BL and BLQ, a substantially identical current therefore flows into said non-selected memory cells from the two bit lines. Thus, assessment by means of current difference formation between the two bit lines is not corrupted or delayed.

For all the illustrated exemplary embodiments of the SRAM memory cells according to the invention, it may be advantageous if, while reading the SRAM memory cell in a memory cell array having in each case a plurality of SRAM memory cells constructed in the same way, use is made of current sense amplifiers whose delay is advantageously low depending on or independently of the capacitance of the bit line BL and BLQ. Such current sense amplifiers are disclosed for example in Seevinck, E. et al.: "Current-Mode Techniques for High-Speed VLSI Circuits with Application to Current Sense Amplifier for CMOS SRAM's" in IEEE Journal of Solid-State Circuits, vol. 26, No. 4, pp. 525-536, April 1991.

In a particularly advantageous manner, the invention makes it possible to prevent the disturbing influence of the leakage current when assessing memory states in memory cells, in particular SRAM memory cells, or carrying out operations of writing/reading memory states to/from a semiconductor memory cell. According to embodiments of the invention, a leakage current that occurs is not suppressed or reduced Rather, a compensation current corresponding to the leakage current is generated, wherein the compensation current flows into the semiconductor memory cell and corresponds to the leakage current in terms of magnitude. Consequently, a respective separate compensation of the leakage current flowing into the respective semiconductor memory cell is achieved in each individual semiconductor memory cell of a memory cell array by means of the invention. The magnitude of the leakage current that flows into the respective non-selected memory cell is unimportant in the case of the invention since a current corresponding to the leakage current is generated in each individual memory cell by means of the simple and efficient circuit arrangement. The logic states stored in the memory nodes of the memory cell can therefore be read or written in/overwritten without a temporal delay occurring on account of leakage currents which may cause an inadequate detection or an inaccuracy in the detection of a current evaluation circuit connected downstream. Consequently, in some embodiments, the leakage current is not suppressed. Rather a compensation current corresponding to the leakage current is generated. The compensation current flows into the semiconductor memory cell and generates a constant additional current (in the case of a differential embodiment) in both memory nodes (on both sides of the memory cell), which has the effect that the absolute value of the current $i_C$ flowing into the selected memory cell is available in its entire magnitude for the assessment. Consequently, the current detected when assessing a memory state via a bit line or via two complementary bit lines is not corrupted or reduced by the leakage current of the non-selected memory cells. The leakage current may be compensated for and may be thus applied as an additional known signal on the data lines in the case of differential assessments or circuit arrangements embodied in differential fashion or may be detected as a constant variable in the assessment in the case of single-ended assessments or single-ended circuit arrangements.

While the foregoing is directed to embodiments of the present invention, other and further embodiments of the invention may be devised without departing from the basic scope thereof, and the scope thereof is determined by the claims that follow.

What is claimed is:

1. An SRAM memory cell comprising:
   first and second memory nodes, each formed between complementary transistors of cross-coupled inverters;
   a first bit line;
   a first transistor, wherein the source and drain of the first transistor are connected to the first bit line and the first memory node, respectively, such that a larger leakage current flows from the first bit line to the first memory node across the first transistor when a first logic state is stored in the first memory node than when a second logic state is stored in the first memory node;
   a second transistor, wherein the source and drain of the second transistor are connected to the first bit line and the second memory node respectively, such that a smaller leakage current flows from the first bit line to the second memory node across the second transistor when a first logic state is stored in the second memory node than when a second logic state is stored in the second memory mode; and
   a third transistor, wherein a source and drain of the third transistor are connected to a second bit line and the second memory node of the memory cell, respectively, wherein the second bit line is complementary to the first bit line, and wherein a gate of the third transistor is connected to a second word line, and wherein the memory cell is capable of performing differential writes using the first transistor and the third transistor.

2. The SRAM memory cell of claim 1, wherein the first memory node holds the state of the memory cell and wherein the second memory node holds the complement of the state of the memory cell.

3. The SRAM memory cell of claim 1, wherein the first transistor and second transistor are n-type transistors, and wherein a gate of the first transistor is connected to a first word line and wherein a gate of the second transistor is connected to a low-voltage.

4. The SRAM memory cell of claim 3, wherein a gate of the third transistor is connected to the word line, wherein the first transistor and third transistor are used to perform writes to the memory cell, and wherein a third leakage current flows across the third transistor when the memory cell is in the second state; and further comprising:
   a fourth transistor, wherein a source, drain, and gate of the fourth transistor are connected to the second bit line, the first memory node of the memory cell, and a low voltage respectively, and wherein a fourth leakage current approximately equal to the third leakage current flows across the fourth transistor when the memory cell is in the first state.

5. A memory device comprising:
   a first bit line;
   a plurality of memory cells, wherein each memory cell comprises first and second memory nodes, each formed between complementary transistors of cross-coupled inverters, and wherein each memory cell is accessed using only a single bit line;

a plurality of first transistors, wherein the source and drain of each first transistor is connected respectively to the first bit line and a corresponding first memory node of a corresponding one of the plurality of memory cells, such that a larger leakage current flows from the first bit line to the corresponding first memory node across each first transistor when a first logic state is stored in the corresponding first memory node than when a second logic state is stored in the corresponding first memory node;

a plurality of second transistors, wherein the source and drain of each second transistor is connected respectively to the first bit line and a corresponding second memory node of a corresponding one of the plurality of memory cells, such that a smaller leakage current flows from the first bit line to the corresponding second memory node across each second transistor when a first logic state is stored in the corresponding second memory node than when a second logic state is stored in the corresponding second memory node and at least one word line, wherein the plurality of first transistors is connected to the at least one word line, and wherein the plurality of second transistors is not connected to any word line.

6. The memory device of claim 5, wherein a respective gate of each of the plurality of first transistors is connected to a corresponding plurality of word lines, and wherein a gate of each of the plurality of second transistors is connected to a low-voltage.

7. The memory device of claim 5, wherein each of the plurality of memory cells is incapable of performing a differential write.

8. A memory device comprising:
a plurality of memory cells, wherein each memory cell comprises first and second memory nodes, each formed between complementary transistors of cross-coupled inverters, wherein each of the plurality of memory cells is capable of performing differential writes and wherein each of the plurality of memory cells is capable of performing single-ended read operations;
a first bit line;
a plurality of first transistors, wherein the source and drain of each first transistor is connected respectively to the first bit line and a corresponding first memory node of a corresponding one of the plurality of memory cells, such that a larger leakage current flows from the first bit line to the corresponding first memory node across each first transistor when a first logic state is stored in the corresponding first memory node than when a second logic state is stored in the corresponding first memory node;
a plurality of second transistors, wherein the source and drain of each second transistor is connected respectively to the first bit line and a corresponding second memory node of a corresponding one of the plurality of memory cells, such that a smaller leakage current flows from the first bit line to the corresponding second memory node across each second transistor when a first logic state is stored in the corresponding second memory node than when a second logic state is stored in the corresponding second memory node; and
at least one word line, wherein the plurality of first transistors is connected to the at least one word line, and wherein the plurality of second transistors is not connected to any word line.

9. A memory device comprising:
a plurality of memory cells, wherein each memory cell comprises first and second memory nodes, each formed between complementary transistors of cross-coupled inverters, wherein each of the plurality of memory cells is capable of performing differential writes and wherein each of the plurality of memory cells is incapable of performing single ended read operations;
a first bit line;
a plurality of first transistors, wherein the source and drain of each first transistor is connected respectively to the first bit line and a corresponding first memory node of a corresponding one of the plurality of memory cells, such that a larger leakage current flows from the first bit line to the corresponding first memory node across each first transistor when a first logic state is stored in the corresponding first memory node than when a second logic state is stored in the corresponding first memory node;
a plurality of second transistors, wherein the source and drain of each second transistor is connected respectively to the first bit line and a corresponding second memory node of a corresponding one of the plurality of memory cells, such that a smaller leakage current flows from the first bit line to the corresponding second memory node across each second transistor when a first logic state is stored in the corresponding second memory node than when a second logic state is stored in the corresponding second memory node; and
at least one word line, wherein the plurality of first transistors is connected to the at least one word line, and wherein the plurality of second transistors is not connected to any word line.

10. A memory device comprising:
a plurality of memory cells, wherein a first leakage current flows from a bit line across a first transistor to a first node of each memory cell when the memory cell is in a first state, wherein the first leakage current has a smaller magnitude when the memory cell is in a second state, and wherein a second leakage current approximately equal to the first leakage current flows from the bit line across a second transistor to a second node of each memory cell when the memory cell is in the second state, wherein the second leakage current has a smaller magnitude when the memory cell is in the first state, and wherein each memory cell is accessed using only a single bit; and
at least one word line, wherein the first transistor is connected to the at least one word line, and wherein the second transistor is not connected to any word line.

11. The memory device of claim 10, wherein the memory device further comprises:
a sense amplifier for sensing a current of the bit line, wherein a combined leakage current equal to the first leakage current and second leakage current for each memory cell reduces the current of the bit line approximately a same amount regardless of the state of the memory cell.

12. The memory device of claim 10, wherein a source and drain of the first transistor and second transistor are coupled to the bit line and the first memory node of the memory cell respectively, wherein a gate of the first transistor is connected to the at least one word line, and wherein a gate of the second transistor is connected to a low potential.

13. The memory device of claim 10, wherein the memory device does not compensate for the first leakage current or the second leakage current by suppressing or reducing the first leakage current and the second leakage current.

14. The memory device of claim 10, wherein the first leakage current does not flow across the respective first transistor to the first memory node of each of the plurality of memory cells when the memory cell is in the second state.

15. A method for equalizing an effect of a first plurality of leakage currents on a current of a bit line of a memory device, wherein the first plurality of leakage currents flow from the bit line to each of a plurality of respective memory cells of the memory device when each of the memory cells is in a first state, and wherein the first plurality of leakage currents are reduced when each of the memory cells is in a second state, the method comprising:

generating a second plurality of leakage currents flowing from the bit line to each of the plurality of respective memory cells when each of the memory cells is in the second state, wherein the second leakage current when each of the memory cells in the second state is approximately equal to the first leakage current when each of the memory cells is in the first state, wherein the second plurality of leakage currents are reduced when each of the memory cells is in the first state, and wherein a combined effect of the first and second plurality of leakage currents on the current of the bit line is the same regardless of the state of each of the plurality of memory cells.

16. The method of claim 15, wherein the first leakage current for each memory cell flows from the bit line across a first transistor to the memory cell, and wherein generating the second plurality of leakage currents comprises:

inserting a second transistor into each memory cell, wherein the second transistor is designed to conduct the second leakage current for the memory cell, wherein the second leakage current flows from the bit line across the second transistor to each memory cell if the memory cell is in the second state, and wherein the first leakage current does not flow to each memory cell if the memory cell is in the second state.

17. A semiconductor memory cell connected to at least one data line, comprising:

at least one memory node;

at least one word line:

at least one selection transistor connected to the at least one memory node, the at least one data line and a first word line, wherein the semiconductor memory cell comprises a transistor for compensating for a leakage current, the transistor being designed such that a current corresponding to the leakage current flows into the semiconductor memory cell, and wherein each memory cell is accessed using only a single bit line, wherein the at least one selection transistor is connected to the at least one word line, and wherein the transistor for compensating for a leakage current is not connected to any word line.

18. The semiconductor memory cell of claim 17, wherein the leakage current flows to the memory cell when the memory cell is in a first state, wherein the leakage current does not flow to the memory cell when the memory cell is in a second state, wherein the current corresponding to the leakage current flows to the memory cell when the memory cell is in the second state, and wherein the current corresponding to the leakage current does not flow to the memory cell when the memory cell is in the first state.

* * * * *

UNITED STATES PATENT AND TRADEMARK OFFICE
CERTIFICATE OF CORRECTION

PATENT NO. : 7,504,695 B2
APPLICATION NO. : 11/137294
DATED : March 17, 2009
INVENTOR(S) : Martelloni et al.

Page 1 of 1

It is certified that error appears in the above-identified patent and that said Letters Patent is hereby corrected as shown below:

Column 3, Line 41, please delete "I-ic" and insert --$I\text{-}i_c$-- therefor;

Column 14, Claim 10, Line 46, please delete "bit" and insert --bitline-- therefor.

Signed and Sealed this

Twenty-fourth Day of November, 2009

David J. Kappos
*Director of the United States Patent and Trademark Office*